United States Patent
Jang et al.

(10) Patent No.: US 11,837,577 B2
(45) Date of Patent: Dec. 5, 2023

(54) SYSTEM-IN-PACKAGE MODULE

(71) Applicant: Samsung Electronics Co., Ltd., Suwon-si (KR)

(72) Inventors: Ae-Nee Jang, Seoul (KR); Kyung Suk Oh, Seongnam-si (KR); Eunseok Song, Hwaseong-si (KR); Seung-Yong Cha, Hwaseong-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 17/853,140

(22) Filed: Jun. 29, 2022

(65) Prior Publication Data

US 2022/0328454 A1    Oct. 13, 2022

Related U.S. Application Data

(63) Continuation of application No. 16/883,153, filed on May 26, 2020, now Pat. No. 11,398,454.

(30) Foreign Application Priority Data

Oct. 18, 2019 (KR) .................... 10-2019-0130148

(51) Int. Cl.
*H01L 23/528* (2006.01)
*H01L 25/065* (2023.01)
*H01L 25/18* (2023.01)

(52) U.S. Cl.
CPC ........ *H01L 25/0652* (2013.01); *H01L 23/528* (2013.01); *H01L 25/18* (2013.01);
(Continued)

(58) Field of Classification Search
CPC ............ H01L 25/0652; H01L 25/0655; H01L 2027/11874–11881; H01L 2224/1451;
(Continued)

(56) References Cited

U.S. PATENT DOCUMENTS 6,908,856 B2    6/2005 Beyne et al.
7,138,721 B2    11/2006 Kim et al.
(Continued)

FOREIGN PATENT DOCUMENTS

CN    107768349 A    3/2018
TW    200909336 A    3/2009
WO    WO-2008/003223 A1    1/2008

OTHER PUBLICATIONS

Office Action dated Jul. 8, 2021 for corresponding U.S. Appl. No. 16/883,153.
(Continued)

*Primary Examiner* — Bradley Smith
*Assistant Examiner* — William Henry Anderson
(74) *Attorney, Agent, or Firm* — Harness, Dickey & Pierce, P.L.C.

(57) ABSTRACT

A system-in-package module includes a substrate, an application specific integrated circuit (ASIC) chip on the substrate, first wafer level package (WLP) memories on the substrate spaced apart from the ASIC chip in a first direction parallel to an upper surface of the substrate, and second WLP memories on the substrate spaced apart from the ASIC chip in a direction opposite to the first direction.

20 Claims, 10 Drawing Sheets

(52) U.S. Cl.
CPC ............... *H01L 2225/06513* (2013.01); *H01L 2225/06517* (2013.01); *H01L 2225/06541* (2013.01); *H01L 2225/06572* (2013.01); *H01L 2225/06586* (2013.01)

(58) Field of Classification Search
CPC ......... H01L 2224/14515; H01L 23/528; H01L 23/535; H01L 23/538; H01L 23/5381–5384; H01L 23/5386; H01L 24/97; H01L 2224/02373; H01L 2224/02375; H01L 2225/06572
See application file for complete search history.

(56) References Cited

U.S. PATENT DOCUMENTS

| | | | |
|---|---|---|---|
| 7,706,149 B2 | 4/2010 | Yang et al. | |
| 9,299,626 B2 | 3/2016 | Chen | |
| 9,466,592 B2 | 10/2016 | Chen et al. | |
| 10,497,689 B2 | 12/2019 | Chang et al. | |
| 2008/0001277 A1 | 1/2008 | Wen et al. | |
| 2015/0355220 A1 | 12/2015 | Kang et al. | |
| 2016/0111406 A1* | 4/2016 | Mak | H01L 25/18 257/773 |
| 2017/0194290 A1 | 7/2017 | Yu et al. | |
| 2017/0213776 A1* | 7/2017 | Oikawa | H01L 25/0655 |
| 2018/0047663 A1* | 2/2018 | Camarota | H01L 25/18 |
| 2018/0157782 A1* | 6/2018 | Rossi | H01L 23/5386 |
| 2018/0158779 A1 | 6/2018 | Yang et al. | |
| 2018/0190635 A1 | 7/2018 | Choi et al. | |
| 2018/0261260 A1 | 9/2018 | Hirashima et al. | |
| 2018/0337120 A1 | 11/2018 | Cho et al. | |
| 2019/0043835 A1 | 2/2019 | Lee et al. | |
| 2019/0088621 A1 | 3/2019 | Yang et al. | |
| 2019/0206807 A1 | 7/2019 | Cho | |
| 2019/0206837 A1* | 7/2019 | Kurita | H01L 23/49811 |
| 2019/0229092 A1 | 7/2019 | Ding et al. | |
| 2020/0111734 A1 | 4/2020 | Lin et al. | |
| 2021/0193615 A1* | 6/2021 | Kwon | H01L 24/10 |
| 2022/0028848 A1* | 1/2022 | Baek | H01L 23/5382 |
| 2022/0046797 A1* | 2/2022 | Seok | H05K 1/181 |

OTHER PUBLICATIONS

Office Action dated Dec. 8, 2021 for corresponding U.S. Appl. No. 16/883,153.

Notice of Allowance dated Mar. 22, 2022 for corresponding U.S. Appl. No. 16/883,153.

* cited by examiner

| Memory | 2-Chip FBGA Package | 2 FI-WLPs |
|---|---|---|
| Layout | x16 Chip / x16 Chip / x32 FBGA FO WLP | x16 FI WLP / x16 FI WLP |
| IO | x32 | x16 x2 |
| Size | 14x12mm | 9.13x11.08mm |
| Ball Map | Specification Dependent | Customized |
| Thickness | 4.1mm | 2.5mm |

FIG. 10

| SiP Module | ASIC Chip + 4 FBGAs | ASIC Chip + 8 FI WLPs |
|---|---|---|
| Layout | x32 FBGA, x32 FBGA, ASIC Chip, x32 FBGA, x32 FBGA | WLP×4, ASIC Chip, WLP×4 |
| ASIC size | 18.0x15.83mm | |
| Module size | 29.5x43.8mm | 23.4x38.1mm |
| SI | 144mV at 20Gbps | 295mV at 20Gbps |

SYSTEM-IN-PACKAGE MODULE

CROSS-REFERENCE TO RELATED APPLICATIONS

The present application is a continuation of and claims priority under 35 U.S.C. § 120 to U.S. patent application Ser. No. 16/883,153, filed on May 26, 2020, which claims priority to 35 U.S.C. § 119 to Korean Patent Application No. 10-2019-0130148 filed on Oct. 18, 2019, in the Korean Intellectual Property Office, the disclosures of which are incorporated by reference herein in their entireties.

BACKGROUND

Embodiments of the inventive concepts described herein relate to semiconductor packages, and more particularly, relate to system-in-package modules providing improved reliability and improved signal integrity.

A system-in-package (SiP) may include a processor and a memory in one semiconductor package to implement one system. The system-in-package has been introduced and used in various fields due to the advantage of dramatically reducing a size of the system.

There may be a large difference in performance and reliability of the system-in-package depending on what type of components is provided inside the system-in-package. Therefore, research on system-in-package implementation which is capable of further improving the performance and reliability of the system-in-package is continuously desired.

SUMMARY

Embodiments of the inventive concepts provide a system-in-package module providing improved reliability and signal integrity.

According to an example embodiment, a system-in-package module includes a substrate, an application specific integrated circuit (ASIC) chip on the substrate, first wafer level package (WLP) memories on the substrate spaced apart from the ASIC chip in a first direction parallel to an upper surface of the substrate, and second WLP memories on the substrate spaced apart from the ASIC chip in a direction opposite to the first direction.

According to an example embodiment, a system-in-package module includes a substrate, an application specific integrated circuit (ASIC) chip on the substrate, first wafer level package (WLP) memories on the substrate spaced apart from the ASIC chip in a first direction parallel to an upper surface of the substrate, and second WLP memories on the substrate spaced apart from the ASIC chip in a direction opposite to the first direction. The ASIC includes an ASIC substrate, a logic chip on the ASIC substrate, and memory chips stacked on the logic chip.

According to an example embodiment, a system-in-package module includes a substrate, an application specific integrated circuit (ASIC) chip on the substrate through solder bumps, first fan-in wafer level package (FI-WLP) memories spaced apart from the ASIC chip in a first direction and mounted on the substrate through first memory solder balls, the first direction parallel to an upper surface of the substrate, second FI-WLP memories spaced apart from the ASIC chip in a direction opposite to the first direction and mounted on the substrate through second memory solder balls, third FI-WLP memories spaced apart from the ASIC chip in a second direction and mounted on the substrate, the second direction perpendicular to the first direction and parallel to the upper surface of the substrate, fourth FI-WLP memories spaced apart from the ASIC chip in a direction opposite to the second direction and mounted on the substrate, solder balls disposed on a bottom surface of the substrate and electrically connected to the ASIC chip, and a mold surrounding the substrate, the ASIC chip, the first FI-WLP memories, the second FI-WLP memories, the third FI-WLP memories, and the fourth FI-WLP memories. A distance between the first FI-WLP memories and the ASIC chip is less than or equal to 5 mm, a distance between the second FI-WLP memories and the ASIC chip is less than or equal to 5 mm, a distance between the third FI-WLP memories and the ASIC chip is less than or equal to 5 mm, and a distance between the fourth FI-WLP memories and the ASIC chip is less than or equal to 5 mm.

BRIEF DESCRIPTION OF THE FIGURES

The above and other objects and features of the inventive concepts will become apparent by describing in detail example embodiments thereof with reference to the accompanying drawings.

FIG. 8 illustrates an example of an arrangement map of components of an ASIC chip.

FIG. 9 illustrates features of an FBGA package and FI-WLPs.

FIG. 10 illustrates features of a system-in-package module implemented with an FBGA package and a system-in-package module implemented with FI-WLPs.

DETAILED DESCRIPTION

Hereinafter, embodiments of the inventive concepts will be described clearly and in detail so that those skilled in the art may easily carry out the inventive concepts.

Figure 1:
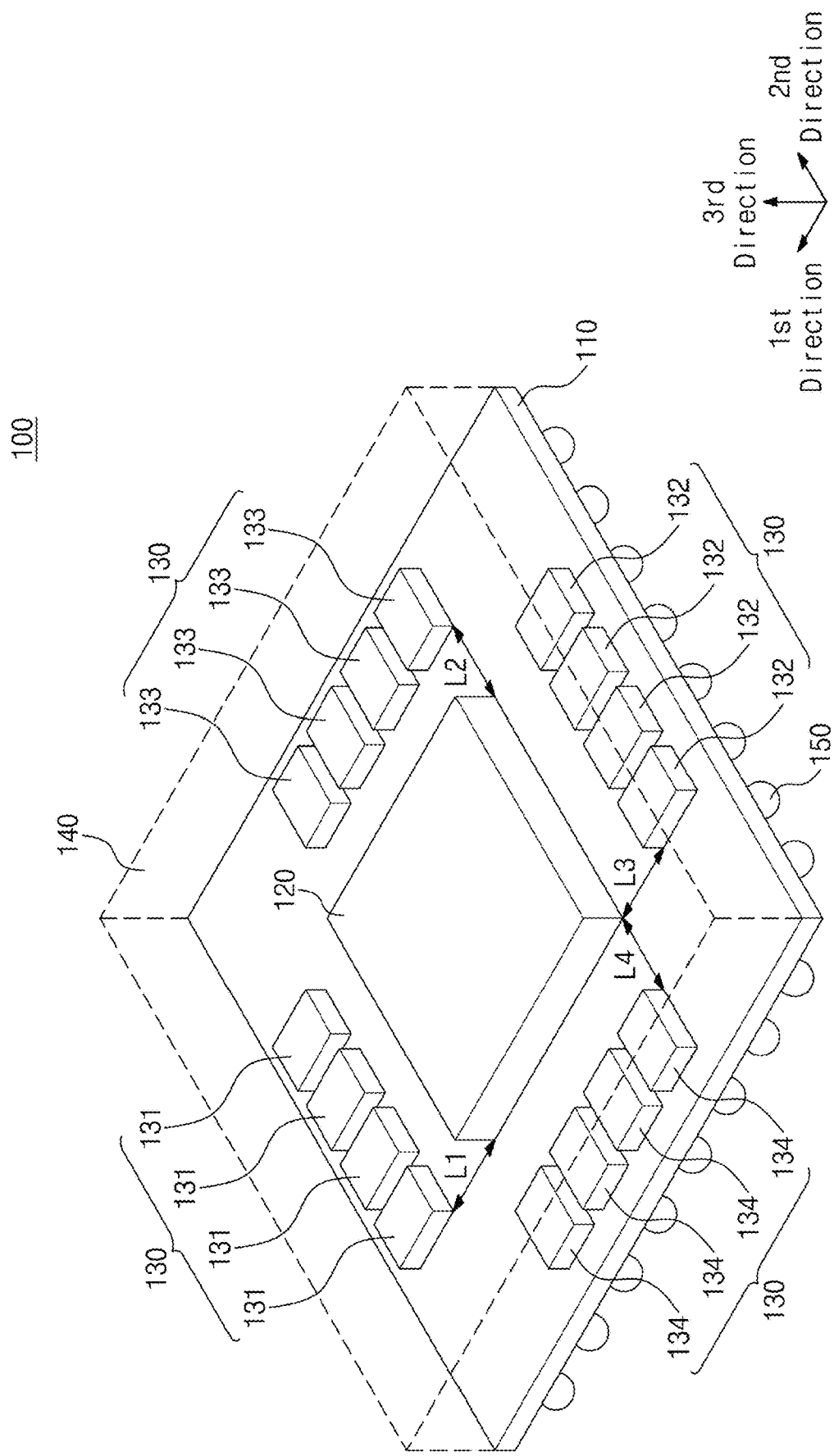
FIG. 1 is a perspective view illustrating a system-in-package module according to an embodiment of the inventive concepts.
Figure 2:
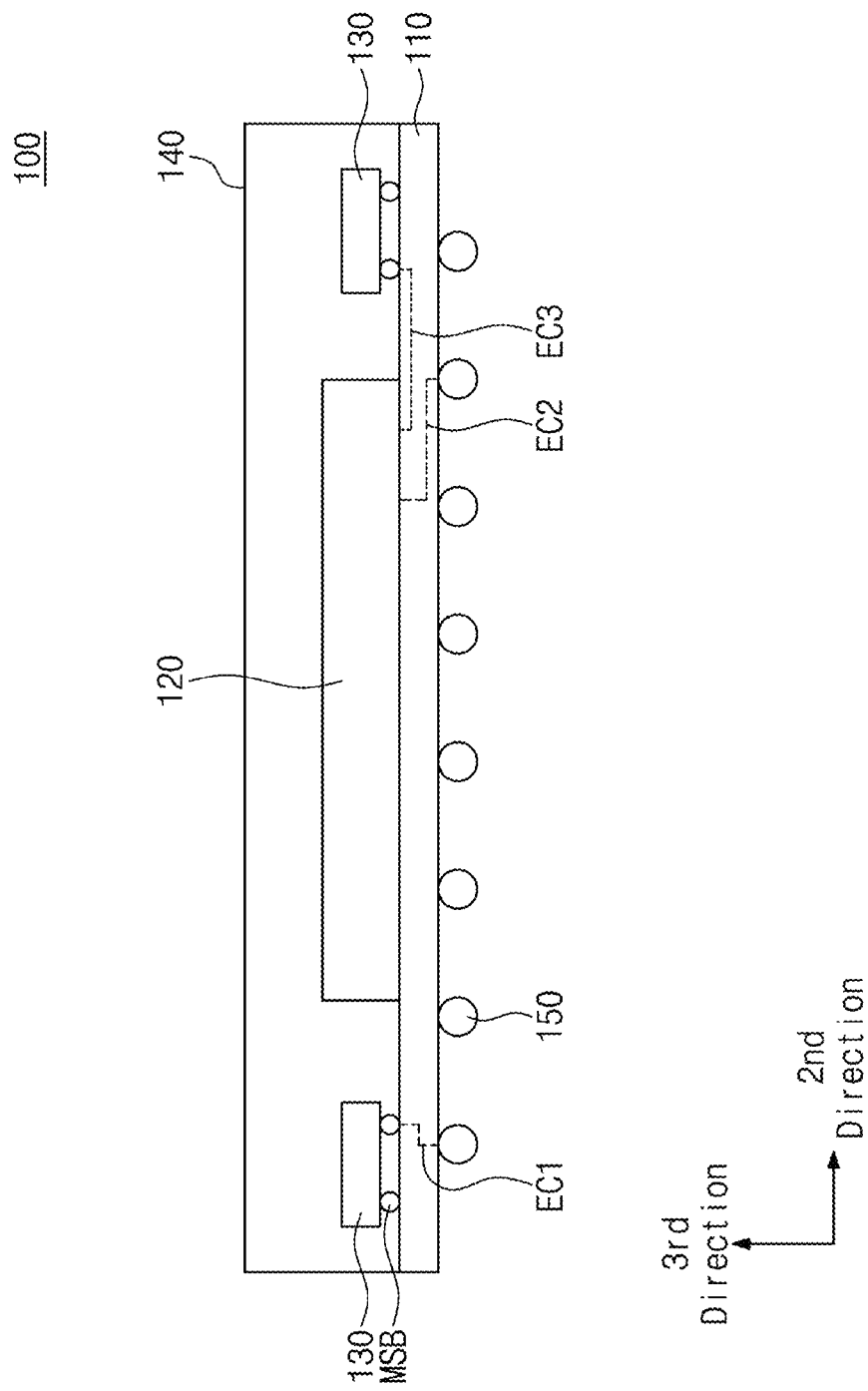
FIG. 2 is a cross-sectional view of a plane corresponding to second and third directions of a system-in-package module.

FIG. 1 is a perspective view illustrating a system-in-package module 100 according to an embodiment of the inventive concepts. FIG. 2 is a cross-sectional view of a plane corresponding to second and third directions of the system-in-package module 100.

Referring to FIGS. 1 and 2, the system-in-package module 100 may include a substrate 110 on a plane formed by a first direction and a second direction perpendicular to the first direction. The substrate 110 may include a printed circuit board (PCB).

An application specific integrated circuit (ASIC) chip 120 may be disposed on the substrate 110, for example, on an upper surface of a third direction. The ASIC chip 120 may be a flip chip electrically connected to and mounted on the substrate 110 through solder bumps. The mounting may include that the ASIC chip 120 is physically arranged (and fixed) on the substrate 110 and electrically connected with the substrate 110 through solder bumps. For example, the solder bumps may be manufactured through processes (e.g., including deposition, masking, or etching) for manufacturing the ASIC chip 120.

Wafer level package (WLP) memories 130 may be disposed on the substrate 110, for example, on the upper surface of the third direction. For example, the WLP memories 130 may include fan-in WLP (FI-WLP) memories or fan-out WLP (FO-WLP) memories.

In some example embodiments, it may be assumed that the WLP memories 130 are the FI-WLP memories. Thus, the FI-WLP memories 130 will be mentioned below. However, technical idea of the inventive concepts may be equally applied to the FO-WLP memories. That is, in the description below, the FI-WLP memories 130 may be equally substituted with the FO-WLP memories 130.

The FI-WLP memories 130 may be disposed in a form surrounding the ASIC chip 120. The FI-WLP memories 130 may include first FI-WLP memories 131, second FI-WLP memories 132, third FI-WLP memories 133, and fourth FI-WLP memories 134.

For example, the first FI-WLP memories 131 may be disposed on a side surface of the first direction of the ASIC chip 120. The second FI-WLP memories 132 may be disposed on a side surface of a direction opposite to the first direction of the ASIC chip 120. The third FI-WLP memories 133 may be disposed on a side surface of a second direction of the ASIC chip 120. The fourth FI-WLP memories 134 may be disposed on a side surface of a direction opposite to the second direction of the ASIC chip 120.

The FI-WLP memories 130 may be electrically connected to the substrate 110 through memory solder balls MSB. The memory solder balls MSB may be attached after the processes of the FI-WLP memories 130 are completed. For example, the FI-WLP memories 130 which pass a high frequency test (HFT) may be used as components of the system-in-package module 100.

The high frequency test (HFT) may be a test to check speed of the memories. The high frequency test (HFT) may not be performed when each memory is in a form of a chip (or die) but may be performed when the memories are in a form of a package.

That is, when a memory chip is used as a component in the system-in-package module, the memory chip may not pass the high frequency test (HFT). When used as a component of the system-in-package module, the memory chip may not meet a target speed (or performance) and the performance of the system-in-package module may be degraded.

The system-in-package module 100 according to an example embodiment of the inventive concepts includes FI-WLP memories 130, which pass the high frequency test (HFT), as a component. Thus, the performance of the FI-WLP memories 130 is ensured and the performance of the system-in-package module 100 may be ensured.

On the substrate 110, for example, on the upper surface of the third direction, a mold 140 may be provided to surround the ASIC chip 120 and the FI-WLP memories 130. The mold 140 may protect the ASIC chip 120 and the FI-WLP memories 130 from external stimulus and impact.

Solder balls 150 may be provided below the substrate 110, for example, on a lower surface of a direction opposite to the third direction. The solder balls 150 may be electrically connected to the substrate 110. In addition, the solder balls 150 may electrically connect an external device, to which the system-in-package module 100 is attached, to components inside the system-in-package module 100.

For example, the substrate 110 may include at least one of a first electrical connection EC1 electrically connecting at least one of the FI-WLP memories 130 to at least one of the solder balls 150, a second electrical connection EC2 electrically connecting the ASIC chip 120 to at least one of the solder balls 150, and a third electrical connection EC3 electrically connecting the ASIC chip 120 and the FI-WLP memories 130 to each other. The first electrical connection EC1, the second electrical connection EC2, or the third electrical connection EC3 may include metal wires of the substrate 110.

For example, the ASIC chip 120 may include a graphic processing unit (GPU) or a neural processing unit (NPU). The FI-WLP memories 130 may include a dynamic random access memory (DRAM) that the ASIC chip 120 uses to perform operations. The FI-WLP memories 130 may include a graphic double data rate (GDDR) DRAM or a low power DDR (LPDDR) DRAM.

The FI-WLP memories 130 have a smaller size than a size of a normal package, for example, a fine ball grid array (FBGA) package. The FI-WLP memories 130 have a size similar to a size of a memory chip. As the FI-WLP memories 130 are used as a component of the system-in-package module 100, a distance between the FI-WLP memories 130 and the ASIC chip 120, for example, a first distance L1, a second distance L2, a third distance L3, or a fourth distance L4 may be shortened in comparison with when the FBGA package memory is used.

As the distance between the FI-WLP memories 130 and the ASIC chip 120 is shortened, a length of a path electrically connecting the FI-WLP memories 130 to the ASIC chip 120 may be shortened. Accordingly, signal integrity of the system-in-package module 100 may be improved and performance and reliability of the system-in-package module 100 may be improved.

In FIGS. 1 and 2, an example embodiment where the FI-WLP memories 130 are disposed on four side surfaces of the ASIC chip 120 has been described. However, the FI-WLP memories 130 may be symmetrically disposed at two side surfaces of the ASIC chip 120. For example, when the number of FI-WLP memories 130 decreases, the FI-WLP memories 130 may be symmetrically disposed at the two side surfaces of the ASIC chip 120.

For example, in FIG. 1 and FIG. 2, specific numbers of the FI-WLP memories 130, the memory solder balls MSB, and the solder balls 150 are shown. However, the numbers of the FI-WLP memories 130, the memory solder balls MSB and the solder balls 150 may be changed without being limited.

Figure 3:
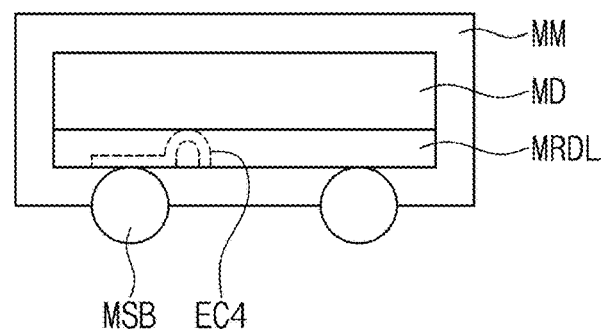
FIG. 3 illustrates an example cross-sectional view of a FI-WLP memory.

FIG. 3 illustrates an example cross-sectional view of a FI-WLP memory 13x. Referring to FIGS. 1 and 3, the FI-WLP memory 13x includes a memory chip MD, a memory redistribution layer MRDL provided below the memory chip MD, the memory solder balls MSB provided below the memory redistribution layer MRDL, and a memory mold MM surrounding the memory chip MD, the memory redistribution layer MRDL, and a part of the memory solder balls MSB.

The memory redistribution layer MRDL may include a fourth electrical connection EC4 electrically connecting the memory solder balls MSB to the memory chip MD. The FI-WLP memory 13x may be a molded WLP (mWLP) based on a structure in which the memory mold MM partially surrounds the memory solder balls MSB.

Figure 4:
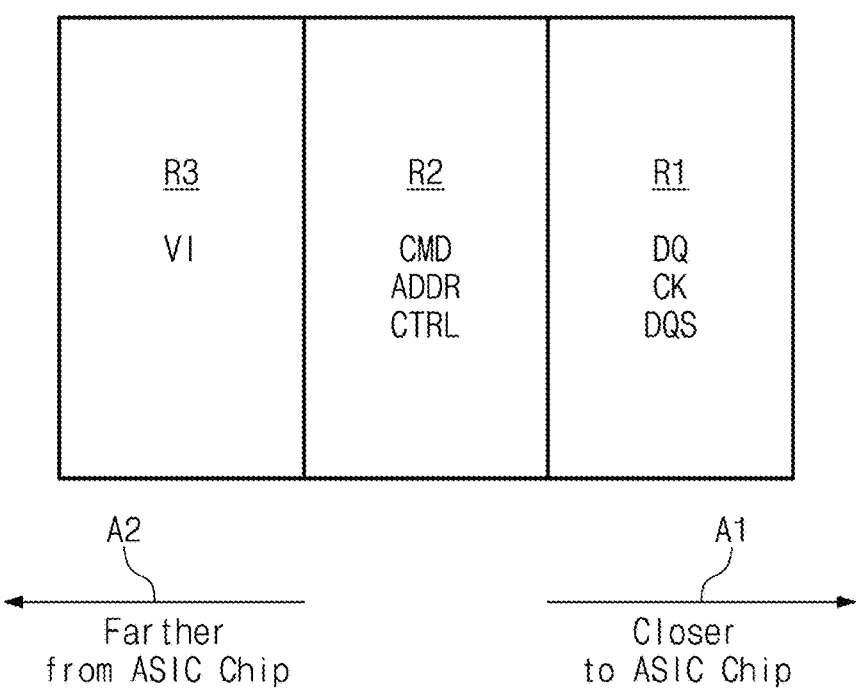
FIG. 4 illustrates an example of a ball map of a FI-WLP memory.

FIG. 4 illustrates an example of a ball map 13x_BM of the FI-WLP memory 13x. For example, the ball map 13x BM may also be referred to as a ball out. Referring to FIGS. 1, 3, and 4, since the FI-WLP memory 13x is used in the system-in-package module 100, the FI-WLP memory 13x may not follow a ball map based on a typical DRAM standard, but may have a customized ball map.

For example, the ball map 13x_BM of the FI-WLP memory 13x may be configured to improve the performance or reliability of the system-in-package module 100. The ball map 13x BM of the FI-WLP memory 13x may be divided into a first region R1, a second region R2, and a third region R3.

As indicated by a first arrow A1, the first region R1 may be closest to the ASIC chip 120. As indicated by a second arrow A2, the third region R3 may be furthest from the ASIC chip 120. The second region R2 may be between the first region R1 and the third region R3. The regions R1 to R3 may be equal or unequal in size, and may be, for example, rectangular, or have nonlinear boundaries.

For example, when the FI-WLP memory 13x is one of the first FI-WLP memories 131, the first arrow A1 may correspond to a direction opposite to the first direction. When the FI-WLP memory 13x is one of the second FI-WLP memories 132, the first arrow A1 may correspond to the first direction. When the FI-WLP memory 13x is one of the third FI-WLP memories 133, the first arrow A1 may correspond to a direction opposite to the second direction. When the FI-WLP memory 13x is one of the fourth FI-WLP memories 134, the first arrow A1 may correspond to the second direction.

The memory solder balls of the first region R1 closest to the ASIC chip 120 may carry signals, which toggle (or transition) fastest between a high level (e.g., a positive level) and a low level (e.g., a ground voltage), among signals where the FI-WLP memory 13x communicates with the ASIC chip 120. For example, the ball map 13xBM may be configured to allow the memory solder balls carrying a data input and output signal DQ, a clock signal CK, and/or a data strobe signal DQS to be disposed in the first region R1.

The memory solder balls of the third region R3 furthest from the ASIC chip 120 may receive a voltage input VI which does not transition between the high level and the low level. For example, the ball map 13x BM may be configured to allow the memory solder balls receiving a supply voltage VDD, a ground voltage VSS, an input and output power voltage VDDQ, an input and output ground voltage VSSQ, and/or a high voltage VPP to be disposed in the third region R3.

The memory solder balls of the second region R2 may carry signals which transition between the high level and the low level more slowly than the signals of the first region R1. For example, the ball map 13xBM may be configured to allow the memory solder balls carrying a command CMD, an address ADDR, and/or a control signal CTRL to be disposed in the second region R2.

The command CMD may include at least one of a row address strobe signal RAS, a column address strobe signal CAS, a write enable signal WE, and an activation signal ACT. The address ADDR may include at least one of a chip identifier CID, a bank group address BG, a bank address BA, and addresses A0 to A17.

The control signal CTRL may include at least one of a clock enable signal CKE, a chip select signal CS, an on-die termination signal ODT, a data mask signal DM, a data mask inversion signal DMI, a data bus inversion signal DBI, an auto pre-charge signal AP, a burst chop signal BC, a reset signal RESET, and a warning signal ALERT.

As another example, the command CMD and the address ADDR may be carried through common solder balls of the second region R2 and may be carried, for example, as signals of CA0 to CA6.

As described with reference to FIG. 4, when the memory solder balls carrying the fastest toggling signals are disposed in the first region R1, paths on the substrate 110, through which the fastest toggling signals are communicated between the FI-WLP memory 13x and the ASIC chip 120, are shorter than paths on the substrate 110, through which other signals are communicated. Thus, the signal integrity of the system-in-package module 100 may be further improved.

For example, among the signals of the second region R2, the memory solder balls carrying the address signal ADDR and the command signal CMD, which toggle faster, may be disposed closer to the ASIC chip 120 than the memory solder balls carrying the control signal CTRL. In addition, the memory solder balls receiving the voltage input VI may be disposed between the memory solder balls of the first region R1 and the second region R2, instead of being concentrated and disposed in the third region R3, thereby providing electrical shielding which reduces interference between the signals.

Figure 5:
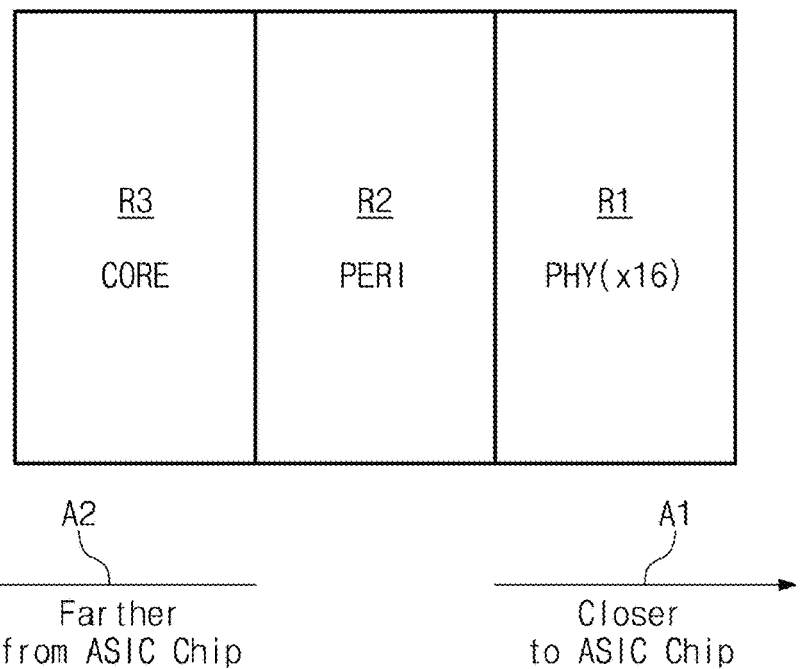
FIG. 5 illustrates an example of an arrangement map of components of a FI-WLP memory.

FIG. 5 illustrates an example of an arrangement map 13x_AM of components of the FI-WLP memory 13x. Referring to FIGS. 1, 3, 4, and 5, as described with reference to FIG. 4, the arrangement map 13x_AM of the FI-WLP memory 13x may have the first region R1 closest to the ASIC chip 120, the third region R3 furthest from the ASIC chip 120, and the second region R2 between the first region R1 and the third region R3.

Physical circuits PHY communicating a signal to the ASIC chip 120 may be disposed in the first region R1. The physical circuits PHY may be configured to communicate 16 data input and output signals (×16) to the ASIC chip 120.

Core circuits CORE, for example, memory cells may be disposed in the third region R3. Peripheral circuits PERI, which access the core circuits CORE and communicate with the physical circuits PHY, may be disposed in the second region R2. As another example, the core circuits CORE and the peripheral circuits PERI may be mixed in the second region R2 and the third region R3.

As described with reference to FIG. 5, when the physical circuits PHY are disposed in the first region R1, paths on the memory redistribution layer MRDL, through which the fastest toggling signals are communicated between the FI-WLP memory 13x and the ASIC chip 120, are shorter than paths on the memory redistribution layer MRDL, through which other signals are communicated. Thus, the signal integrity of the system-in-package module 100 may be further improved.

Figure 6:
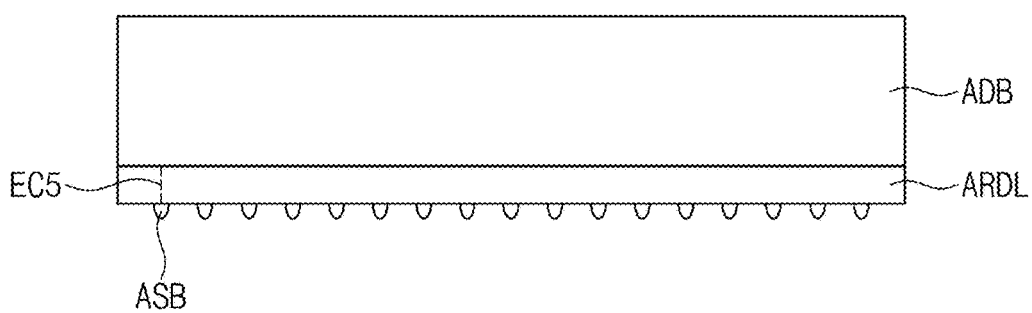
FIG. 6 illustrates an example cross-sectional view of an ASIC chip.

FIG. 6 illustrates an example cross-sectional view of the ASIC chip 120. Referring to FIGS. 1 and 6, the ASIC chip 120 may include an ASIC chip main body ADB, an ASIC redistribution layer ARDL provided below the ASIC chip main body ADB, and ASIC solder bumps ASB provided below the ASIC redistribution layer ARDL.

The ASIC redistribution layer ARDL may include a fifth electrical connection EC5 electrically connecting the ASIC solder bumps ASB to the ASIC chip main body ADB. For example, the ASIC chip main body ADB may be implemented in a mixture of logic components performing logic operations and memory components (e.g., SRAM components).

Figure 7:
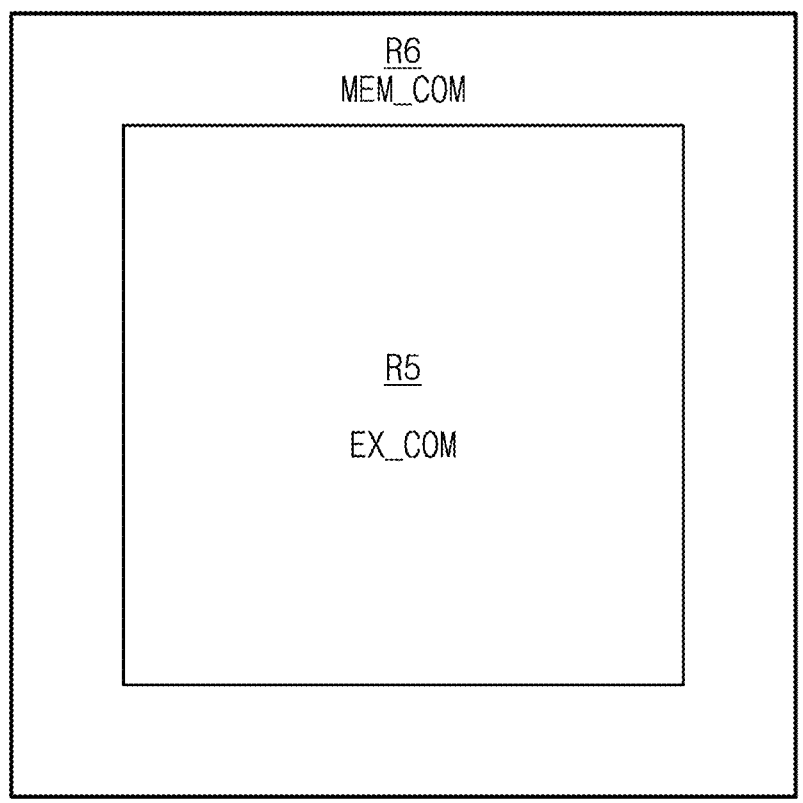
FIG. 7 illustrates an example of a ball map of an ASIC chip.

FIG. 7 illustrates an example of a ball map 120_BM of the ASIC chip 120. For example, the ball map 120_BM may also be referred to as a ball out. Referring to FIGS. 1, 6, and 7, since the ASIC chip 120 is used in the system-in-package module 100, the ASIC chip 120 may not follow the ball map based on the typical DRAM standard, but may have a customized ball map.

For example, the ball map 120_BM of the ASIC chip 120 may be configured to improve the performance or reliability of the system-in-package module 100. The ball map 120_BM of the ASIC chip 120 may be divided into a fifth region R5 and a sixth region R6. The fifth region R5 may be an inner region, and the sixth region R6 may be an outer region. The outer region may be for example, a rectangular shape or a circular shape, but is not limited thereto, with the remainder the inner region.

A distance between the FI-WLP memories 130 and ASIC solder bumps of the sixth region R6 among the ASIC solder bumps ASB of the ASIC chip 120 is shorter than a distance between the FI-WLP memories 130 and the ASIC solder bumps of the fifth region R5. Accordingly, ASIC solder bumps for a memory communication MEM_COM communicating signals to the FI-WLP memories 130 may be disposed in the sixth region R6. ASIC solder bumps for an external communication EX_COM communicating signals to an external device may be disposed in the fifth region R5.

As described with reference to FIG. 4, in the sixth region R6, the ASIC solder bumps carrying the signals, which toggle fastest between the high level and the low level, such as the data input and output signal DQ, the clock signal CK, or the data strobe signal DQS, may be further outward than other ASIC solder bumps. In addition, the ASIC solder bumps, which supply voltages to the FI-WLP memories 130, may be disposed adjacent to the fifth region R5 or between the ASIC solder bumps which carry the toggling signals, thereby providing the electrical shielding. Accordingly, signal integrity between the ASIC chip 120 and the FI-WLP memories 130 may be further improved and the performance of the system-in-package module 100 may be further improved.

As described with reference to FIG. 7, when the ASIC solder balls carrying signals communicating with the FI-WLP memories 130 are disposed in the sixth region R6, paths on the substrate 110, through which signals communicated to the FI-WLP memories 130 are shorter than paths on the substrate 110, through which other signals are communicated. Thus, the signal integrity of the system-in-package module 100 may be further improved.

Figure 8:
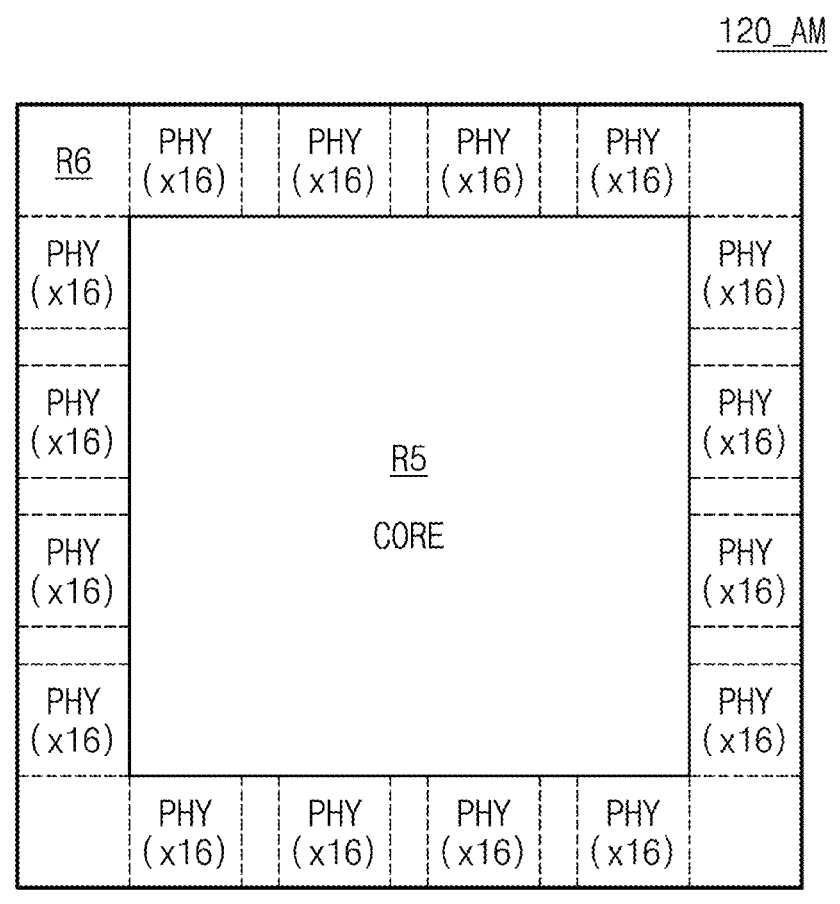

FIG. 8 illustrates an example of an arrangement map 120_AM of components of the ASIC chip 120. Referring to FIGS. 1, 6, 7, and 8, as described with reference to FIG. 7, the arrangement map 120_AM of the ASIC chip 120 may be divided into the fifth region R5 located at a center of the arrangement map 120_AM of the ASIC chip 120 and the sixth region R6 located at a periphery.

The physical circuits PHY communicating a signal to the FI-WLP memories 130 may be disposed in the sixth region R6. For example, the number of physical circuits PHY may be equal to the number of FI-WLP memories 130. Each of the physical circuits PHY may be configured to communicate 16 (×16) the data input and output signals to the ASIC chip 120.

The core circuits CORE, for example, logic components and memory components which perform logic operations may be disposed in the fifth region R5. When the physical circuits PHY are disposed in the sixth region R6 as described with reference to FIG. 8, paths on the ASIC redistribution layer ARDL, through which signals are communicated to the FI-WLP memories 130, are shorter than paths on their ASIC redistribution layer ARDL, through which of other signals are communicated. Thus, the signal integrity of the system-in-package module 100 may be further improved.

FIG. 9 illustrates features of an FBGA package and FI-WLPs. Referring to FIGS. 1 and 9, the FBGA package (a two-chip FBGA package) having two memory chips is compared with FI-WLPs each including one memory chip. Each memory chip may have 16 data inputs and outputs (×16). The FBGA package may be a fan-out WLP (FO-WLP).

The number of data inputs and outputs of the two-chip FBGA package is 32 (×32), and the number of inputs and outputs of the two FI-WLPs is 32 which is twice (×2) of 16 (×16). That is, the two-chip FBGA package and the two FI-WLPs may provide the same input and output bandwidth.

While a size of the two-chip FBGA package is 14×12 mm, a total size when two FI-WLPs are deployed is 9.13×11.08 mm. The two FI-WLPs occupy 40% less area than the two-chip FBGA package. A ball map of the two-chip FBGA package depends on the standard, but the ball map of the two FI-WLPs may be customized, for example, as described with reference to FIG. 4.

A thickness of the two-chip FBGA package is 4.1 mm, while a thickness of two FI-WLPs may be 2.5 mm. As described above, the two FI-WLPs have a reduced size compared to the two-chip FBGA package. Thus, in comparison with using the two-chip FBGA package, when the FI-WLPs are used in the system-in-package module 100, a distance between the ASIC chip 120 and the memory chips may be further reduced and the signal integrity may be improved. In addition, the FI-WLPs may provide better signal integrity than two-chip FBGA package through customization of the ball map.

FIG. 10 illustrates features of a system-in-package module implemented with an FBGA package and a system-in-package module implemented with FI-WLPs. Referring to FIG. 10, the feature of a first system-in-package module including one ASIC chip and four FBGA package memories (e.g., an FO-WLP) is compared with the feature of a second system-in-package module including one ASIC chip and eight FI-WLP memories.

As described with reference to FIG. 9, the four FBGA FO-WLP memories and the eight FI-WLP memories may provide the same input and output bandwidth. Each size of the ASIC chip in the first system-in-package module and the second system-in-package module may be the same as 18.0×15.83 mm.

While a size of the first system-in-package module may be 29.5×43.8 mm, a size of the second system-in-package module is 23.4×38.1 mm. The size of the second system-in-package module using the FI-WLP memories may be reduced by 28% compared to the first system-in-package module using the FBGA FO-WLP memories.

Furthermore, results of simulating the signal integrity of the first system-in-package module and the second system-in-package module are illustrated in FIG. 10. It is shown that the first system-in-package module using the four FBGA FO-WLP memories has signal integrity of 144 mV at 20 Gbps. In contrast, the second system-in-package module using the eight FI-WLP memories has signal integrity of 295 mV at 20 Gbps, which is 105% improvement over the first system-in-package module.

As an example, the signal integrity of 295 mV is a result of specifying a distance (the shortest distance) of 2.5 mm between the ASIC chip and FI-WLP memories. When a distance (the shortest distance) between the ASIC chip and the FI-WLP memories is specified as 5 mm, the second system-in-package module may have 50% improved signal integrity compared to the first system-in-package module.

As described above, the system-in-package module mounting the FI-WLP memories may perform a high frequency test compared to the system-in-package module mounting the memory chips, thereby ensuring performance. In addition, the system-in-package module mounting the FI-WLP memories has a reduced size and improved signal integrity compared to the system-in-package module mounting the FBGA FO-WLP memories.

Figure 11:
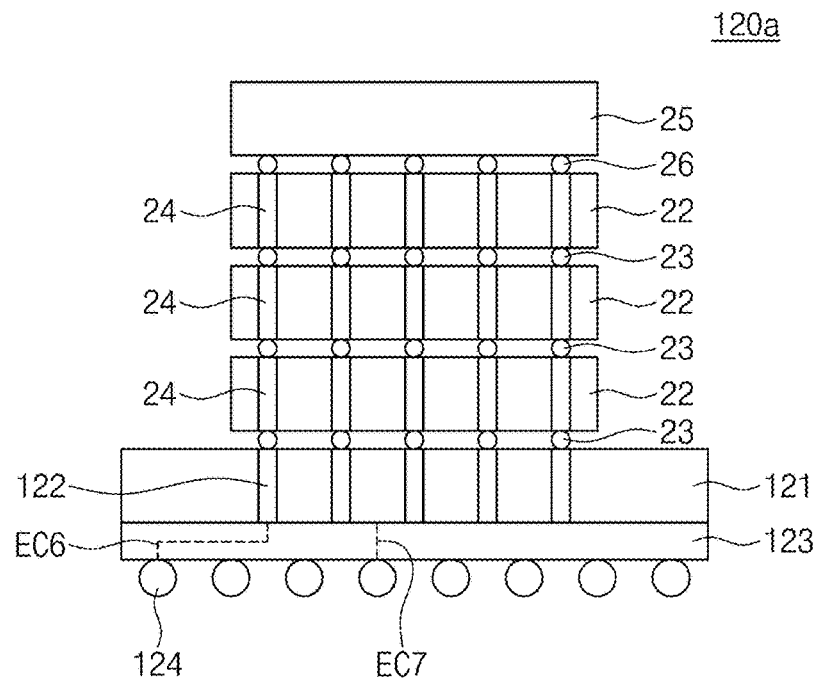
FIG. 11 illustrates an example of an ASIC chip having a stacked structure.

FIG. 11 illustrates an example of an ASIC chip 120a having a stacked structure. Referring to FIG. 11, the ASIC chip 120a may include a logic chip 121 and first memory chips 22 and a second memory chip 25, which are stacked on the logic chip 121. The logic chip 121 may include through silicon vias (TSVs) 122. The first memory chips 22 may include TSVs 24.

The logic chip 121 may be electrically connected to the first memory chips 22 and the second memory chip 25 through the TSV 122. Each of the first memory chips 22 may be connected to the TSV 122 of the logic chip 121 disposed below the lowermost first memory chip 22 or to the TSV 24 of the lower first memory chip 22 through solder bumps 23. The second memory chip 25 may be connected to the TSV 24 of the uppermost first memory chip 22 disposed below the second memory chip 25 through the solder bumps 26.

A redistribution layer 123 and solder bumps 124 (or solder balls) may be provided below the logic chip 121. The redistribution layer 123 may include at least one of a sixth electrical connection EC6 connecting the TSV 122 to at least one of the solder bumps 124 and a seventh electrical connection EC7 electrically connecting at least one of communication pads of the logic chip 121 to at least one of the solder bumps 124.

Figure 12:
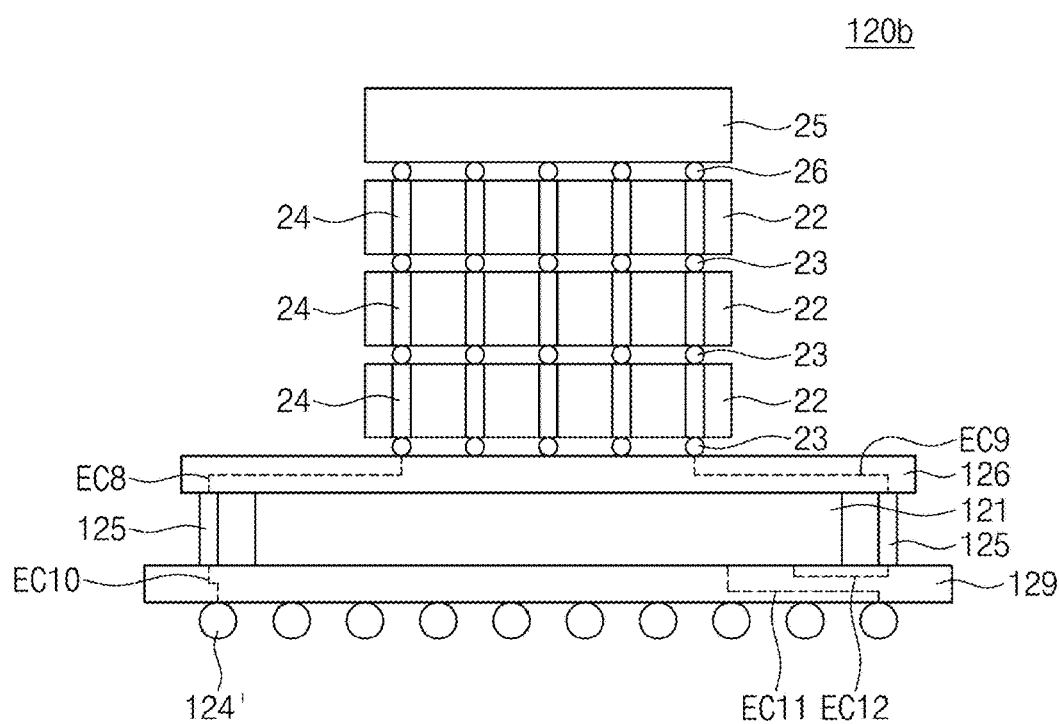
FIG. 12 illustrates another example of an ASIC implemented in a stacked structure.

FIG. 12 illustrates another example of an ASIC 120b implemented in a stacked structure. Referring to FIG. 12, the ASIC 120b may include an ASIC substrate 129, solder balls 124' attached to a bottom surface of the ASIC substrate 129, and the logic chip 121 mounted on the ASIC substrate 129.

An interposer 126 may be provided on the logic chip 121. At least one side surface of the interposer 126 may protrude in parallel with a top surface of the ASIC substrate 129 from a top surface of the logic chip 121. The first memory chips 22 and the second memory chip 25 may be stacked on the interposer 126. The stacked structure of the first memory chips 22 and the second memory chip 25 is the same as that described with reference to FIG. 11. Therefore, duplicated description is omitted.

At least one side surface of the logic chip 121 may be provided with at least one conductive structure 125 which electrically connects the interposer 126 to the ASIC substrate 129. For example, the conductive structure 125 may be a side via. The interposer 126 may include an eighth electrical connection EC8 and a ninth electrical connection EC9 which electrically connect the solder bumps 23 connected to the TSV 24 of the first memory chips 22 to the conductive structure 125.

The ASIC substrate 129 may include at least one of a tenth electrical connection EC10 connecting the conductive structure 125 to at least one of the solder balls 124', an eleventh electrical connection EC11 connecting at least one of the communication pads of the logic chip 121 to at least one of the solder balls 124', and a twelfth electrical connection EC12 connecting the conductive structure 125 to at least one of the communication pads of the logic chip 121.

As an example, the ASIC 120b may be manufactured through a process of an FO-WLP. The ASIC 120b may further include a mold surrounding the substrate 129, the logic chip 121, the interposer 126, the conductive structure 125, the first memory chips 22, and the second memory chip 25. As another example, the ASIC 120b may be mounted on the substrate 110 of the system-in-package module 100 (see FIG. 1) without a mold.

Figure 13:
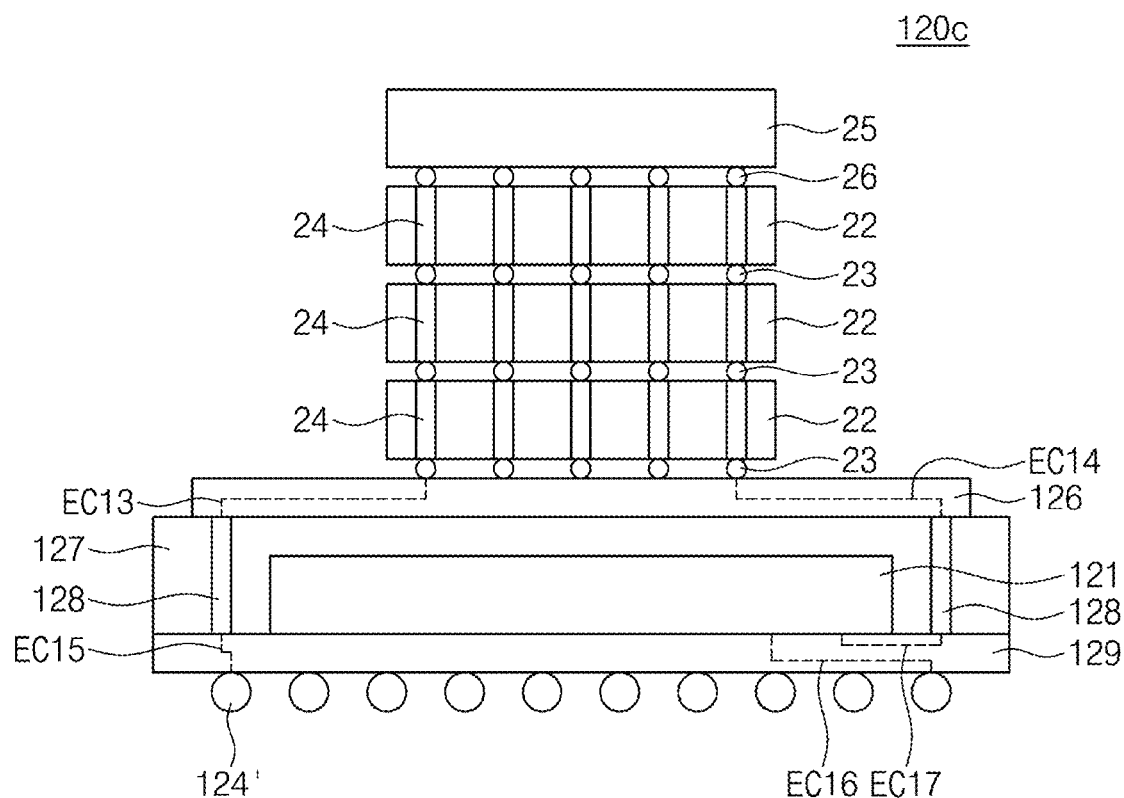
FIG. 13 illustrates still another example of an ASIC implemented in a stacked structure.

FIG. 13 illustrates still another example of an ASIC 120c implemented in a stacked structure. Referring to FIG. 13, the ASIC 120c may include the ASIC substrate 129, the solder balls 124' attached to the bottom surface of the ASIC substrate 129, the logic chip 121 mounted on the ASIC substrate 129, and a mold 127 surrounding the ASIC substrate 129 and the logic chip 121. For example, the ASIC substrate 129, the logic chip 121, the solder balls 124', and the mold 127 may be an FO-WLP.

The interposer 126 may be provided on the mold 127. At least one side surface of the interposer 126 may protrude in parallel with the top surface of the ASIC substrate 129 from the top surface of the logic chip 121. The first memory chips 22 and the second memory chip 25 may be stacked on the interposer 126. The stacked structure of the first memory chips 22 and the second memory chip 25 is the same as that described with reference to FIG. 11. Therefore, duplicated description is omitted.

At least one conductive structure 128 may be provided on at least one side surface of the logic chip 121 to electrically connect the interposer 126 and the ASIC substrate 129 through the mold 127. For example, the conductive structure 128 may be a side via or a through mold via (TMV). The interposer 126 may include a thirteenth electrical connection EC13 and a fourteenth electrical connection EC14 which electrically connect the solder bumps 23 connected to the TSV 24 of the first memory chips 22 to the conductive structure 128.

The ASIC substrate 129 may further include at least one of a fifteenth electrical connection EC15 connecting the conductive structure 125 to at least one of the solder balls 124', a sixteenth electrical connection EC16 connecting at least one of the communication pads of the logic chip 121 to at least one of the solder balls 124', and a seventeenth electrical connection EC17 connecting the conductive structure 128 to at least one of the communication pads of the logic chip 121.

The ASIC 120c may further include a mold surrounding the mold 127, the interposer 126, the first memory chips 22, and the second memory chip 25. As another example, the ASIC 120c may be mounted on the substrate 110 of the system-in-package module 100 (see FIG. 1) without a mold.

Figure 14:
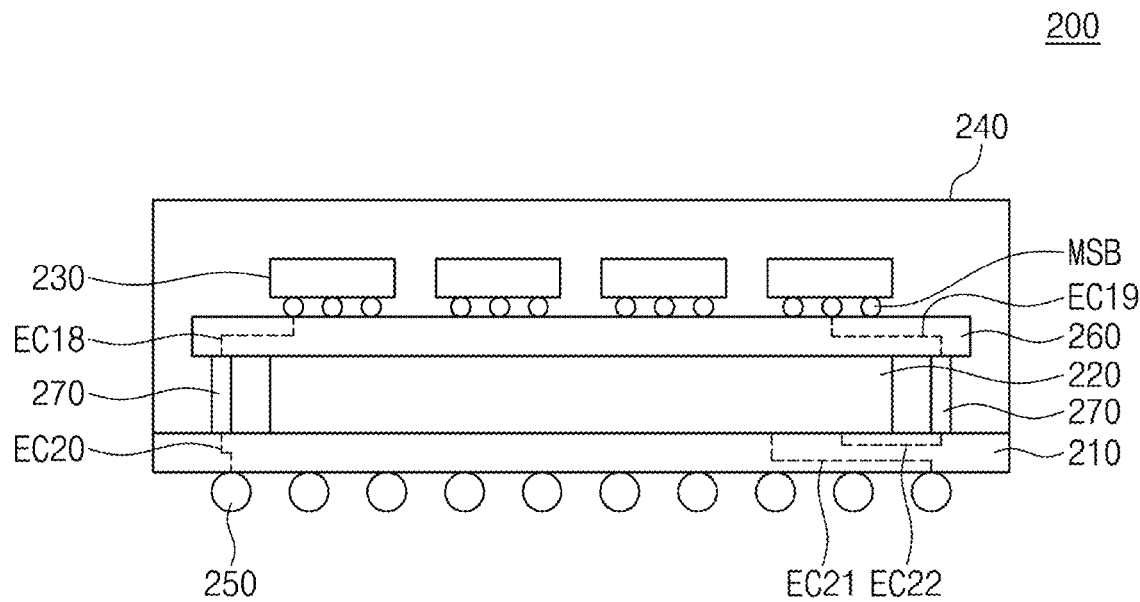
FIG. 14 illustrates a system-in-package module according to another embodiment.

FIG. 14 illustrates a system-in-package module 200 according to another embodiment. Referring to FIG. 14, the system-in-package module 200 includes a substrate 210, an ASIC chip 220 mounted on the substrate 210, an interposer 260 stacked on the ASIC chip 220, and FI-WLP memories 230 mounted on the interposer 260.

The ASIC chip 220 may be a flip chip implemented by mixing logic components and memory components as described with reference to FIGS. 1 to 10. As another example, the ASIC chip 220 may be implemented by stacking memory chips on a logic chip as described with reference to FIG. 11. As still another example, the ASIC chip 220 may be implemented in the form of a package or semi-package including an ASIC substrate, as described with reference to FIGS. 12 and 13.

At least one side surface of the interposer 260 may protrude in parallel with a top surface of the substrate 210 from a top surface of the ASIC chip 220. At least one conductive structure 270 electrically connecting the interposer 260 to the substrate 210 on at least one side surface of the ASIC chip 220.

The FI-WLP memories 230 may be mounted to the interposer 260 through the memory solder balls MSB. The interposer 260 may include an eighteenth electrical connection EC18 and a nineteenth electrical connection EC19 electrically connecting the FI-WLP memories 230 to the conductive structure 270.

Solder balls 250 may be provided on a bottom surface of the substrate 210. The substrate 210 may include at least one of a twentieth electrical connection EC20 electrically connecting the conductive structure 270 to at least one of the solder balls 250, a twenty-first electrical connection EC21 electrically connecting at least one of communication solder bumps (or solder balls) of the ASIC chip 220 to at least one of the solder balls 250, and a twenty-second electrical connection EC22 electrically connecting at least one of the communication solder bumps (or the solder balls) of the ASIC chip 220 to the conductive structure 270.

The system-in-package module 200 may further include a mold 240 surrounding the substrate 210, the ASIC chip 220, the FI-WLP memories 230, the interposer 260, and the conductive structure 270. For example, the system-in-package module 200 may be an FO-WLP.

In the above-described embodiments, the components of the system-in-package module 100 or 200 have been described using terms such as a first, a second, a third, and the like. However, terms such as a first, a second, a third, and the like are used to distinguish the components from each other, and do not limit the inventive concepts. For example, terms such as a first, a second, a third, and the like do not imply numerical order or any form of numerical meaning.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

According to the inventive concepts, the system-in-package may include the memories implemented in the wafer level package (WLP). Thus, the performance of the memories of the system-in-package module is ensured. In addition, the WLP memories are disposed close to the application specific integrated circuit (ASIC) chip. Therefore, the signal integrity of the system-in-package module is improved.

The above description is specific embodiments for practicing the inventive concepts. The inventive concepts will include not only the above-described embodiments but also embodiments which are capable of being simply changed in design or easily changed. In addition, the inventive concepts will also include techniques that are capable of being easily modified and practiced using the embodiments. Therefore, the scope of the inventive concepts should not be limited to the above-described embodiments, but should be defined by the equivalents of the claims of the inventive concepts as well as the following claims.

What is claimed is:

1. A system-in-package module comprising:
   a substrate;
   an application specific integrated circuit (ASIC) chip on the substrate;
   first wafer level package (WLP) memories; and
   second WLP memories,
   wherein each of the first WLP memories and the second WLP memories includes:
      a memory chip; and
      a memory redistribution layer,
   wherein each of the first WLP memories and the second WLP memories includes
      a first region configured to communicate first signals, the first signals toggle between a high level and a low level;
      a second region configured to communicate second signals, the second signals toggle slower than the first signals; and
   wherein the ASIC chip includes
      an outer region of the ASIC chip configured to communicate with the first WLP memories and the second WLP memories; and
      an inner region inside the outer region of the ASIC chip configured to communicate with an external device,
   wherein a first path between the outer region and the first region is shorter than a second path between the outer region and the second region.

2. The system-in-package module of claim 1, wherein the first WLP memories and the second WLP memories are stacked over the ASIC chip.

3. The system-in-package module of claim 2, wherein the first WLP memories and the second WLP memories include through silicon vias electrically connecting the first WLP memories and the second WLP memories.

4. The system-in-package module of claim 3, further comprising:
   an interposer on which the first WLP memories and the second WLP memories are mounted, the interposer forming at least a part of the first path and the second path.

5. The system-in-package module of claim 4, further comprising:
   at least one conductive structure electrically connecting the interposer and the substrate, the at least one conductive structure forming at least another part of the first path and the second path.

6. The system-in-package module of claim 3, further comprising:
   a mold surrounding the ASIC chip on the substrate; and
   an interposer on which the first WLP memories and the second WLP memories are mounted, the interposer forming at least a part of the first path and the second path.

7. The system-in-package module of claim 6, further comprising:
at least one conductive structure electrically connecting the interposer and the substrate through the mold, the at least one conductive structure forming at least another part of the first path and the second path.

8. The system-in-package module of claim 2, further comprising:
an interposer on which the first WLP memories and the second WLP memories are mounted, the interposer forming at least a part of the first WLP memories and the second WLP memories,
wherein the first WLP memories and the second WLP memories are distributed on the interposer.

9. The system-in-package module of claim 8, further comprising:
at least one conductive structure electrically connecting the interposer and the substrate, the at least one conductive structure forming at least another part of the first path and the second path.

10. The system-in-package module of claim 1, wherein the first WLP memories are on the substrate spaced apart from the ASIC chip in a first direction parallel to an upper surface of the substrate, and
wherein the second WLP memories are on the substrate spaced apart from the ASIC chip in a direction opposite to the first direction.

11. The system-in-package module of claim 1, wherein each of the first WLP memories and the second WLP memories further includes:
memory solder balls below the memory chip.

12. The system-in-package module of claim 1, wherein the memory redistribution layer includes electrical connections electrically connecting the memory chip and the memory solder balls.

13. The system-in-package module of claim 1, wherein the first region is closest to the ASIC chip and includes first solder balls, and
wherein the second region is closest to the ASIC chip after the first region and includes second solder balls.

14. The system-in-package module of claim 1, wherein each of the first WLP memories and the second WLP memories further includes:
a third region furthest from the ASIC chip and including third solder balls, configured to receive voltages.

15. The system-in-package module of claim 1, wherein the ASIC chip further includes:
first solder bumps in the outer region; and
second solder bumps in the inner region.

16. The system-in-package module of claim 1, wherein the first WLP memories on the substrate spaced apart from the ASIC chip in a first direction parallel to an upper surface of the substrate; and
second WLP memories on the substrate spaced apart from the ASIC chip in a direction opposite to the first direction.

17. The system-in-package module of claim 1, wherein the first WLP memories include first fan-in WLP (FI-WLP) memories, and
the second WLP memories include second fan-in WLP (FI-WLP) memories.

18. The system-in-package module of claim 1, wherein the first WLP memories include first fan-out WLP (FO-WLP) memories, and
the second WLP memories include second fan-out WLP (FO-WLP) memories.

19. The system-in-package module of claim 1, wherein each of the first WLP memories and the second WLP memories includes
a third region configured to receive voltages.

20. The system-in-package module of claim 19, wherein the third region is disposed between the first region and the second region.

* * * * *

UNITED STATES PATENT AND TRADEMARK OFFICE
CERTIFICATE OF CORRECTION

| | | |
|---|---|---|
| PATENT NO. | : 11,837,577 B2 | Page 1 of 1 |
| APPLICATION NO. | : 17/853140 | |
| DATED | : December 5, 2023 | |
| INVENTOR(S) | : Ae-Nee Jang et al. | |

It is certified that error appears in the above-identified patent and that said Letters Patent is hereby corrected as shown below:

In the Claims

Column 14, Lines 12-18, Claim 16, should read:
16. The system-in-package module of claim 1, wherein
    the first WLP memories on the substrate spaced apart from the ASIC chip in a first direction parallel to an upper surface of the substrate; and
    the second WLP memories on the substrate spaced apart from the ASIC chip in a direction opposite to the first direction.

Signed and Sealed this
Twenty-third Day of January, 2024

Katherine Kelly Vidal
*Director of the United States Patent and Trademark Office*